United States Patent
Toratani et al.

(10) Patent No.: US 8,748,967 B2
(45) Date of Patent: Jun. 10, 2014

(54) SEMICONDUCTOR DEVICE AND METHOD OF FABRICATING THE SAME

(71) Applicant: Kabushiki Kaisha Toshiba, Tokyo (JP)

(72) Inventors: Kenichiro Toratani, Tokyo (JP); Masayuki Tanaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/778,778

(22) Filed: Feb. 27, 2013

(65) Prior Publication Data

US 2013/0240972 A1 Sep. 19, 2013

(30) Foreign Application Priority Data

Mar. 15, 2012 (JP) ................................. 2012-059478

(51) Int. Cl.
*H01L 29/788* (2006.01)

(52) U.S. Cl.
USPC ........... 257/316; 257/317; 257/318; 257/319; 257/320; 257/321; 438/264; 438/265; 438/266

(58) Field of Classification Search
USPC .......................... 257/316–321; 438/264–266
See application file for complete search history.

(56) References Cited

U.S. PATENT DOCUMENTS

| 3,877,054 | A | * | 4/1975 | Boulin et al. | 257/325 |
|---|---|---|---|---|---|
| 3,964,085 | A | * | 6/1976 | Kahng et al. | 428/428 |
| 6,133,150 | A | * | 10/2000 | Nakajima et al. | 438/694 |
| 6,933,219 | B1 | * | 8/2005 | Lingunis et al. | 438/593 |
| 7,371,681 | B2 | * | 5/2008 | Maekawa | 438/656 |
| 8,124,513 | B2 | * | 2/2012 | Lin | 438/591 |
| 8,395,215 | B2 | * | 3/2013 | Lin | 257/347 |
| 2001/0012698 | A1 | * | 8/2001 | Hayashi et al. | 438/782 |
| 2002/0072209 | A1 | * | 6/2002 | Tseng | 438/592 |
| 2006/0261401 | A1 | * | 11/2006 | Bhattacharyya | 257/316 |
| 2008/0073691 | A1 | | 3/2008 | Konno et al. | |
| 2008/0135922 | A1 | | 6/2008 | Mitani et al. | |
| 2008/0274626 | A1 | * | 11/2008 | Glowacki et al. | 438/787 |
| 2011/0175147 | A1 | * | 7/2011 | Adusumilli et al. | 257/288 |
| 2012/0153275 | A1 | * | 6/2012 | Endo et al. | 257/43 |

FOREIGN PATENT DOCUMENTS

| JP | 2009-111227 | 5/2009 |
|---|---|---|
| JP | 2009-238903 | 10/2009 |

* cited by examiner

*Primary Examiner* — Matthew W Such
*Assistant Examiner* — Stephen C Smith
(74) *Attorney, Agent, or Firm* — Finnegan, Henderson, Farabow, Garrett & Dunner, L.L.P.

(57) ABSTRACT

An aspect of the present embodiment, there is provided a semiconductor device, including a semiconductor substrate, a first insulator above the semiconductor substrate, the first insulator containing tungsten, germanium and silicon, a charge storage film on the first insulator, a second insulator on the charge storage film and, a control gate electrode on the second insulator.

20 Claims, 2 Drawing Sheets

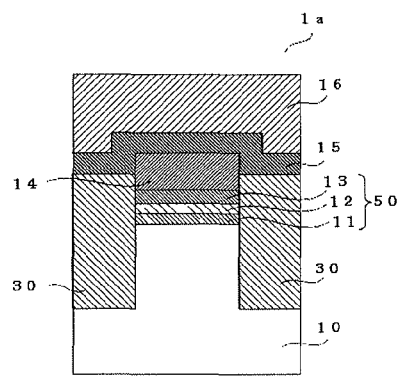
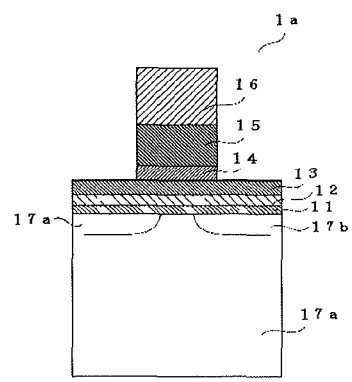
FIG.1A  FIG.1B
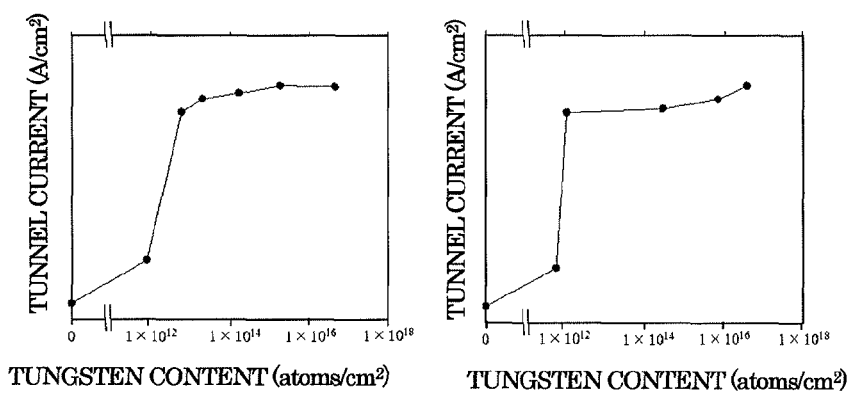
FIG.2A  FIG.2B
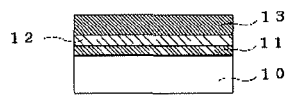
FIG.3A
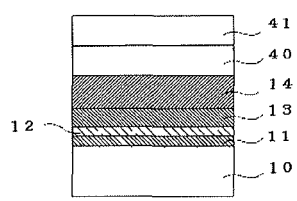
FIG.3B
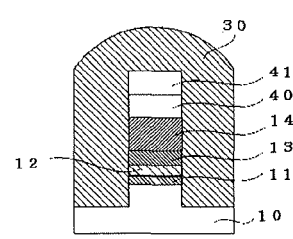
FIG.3C
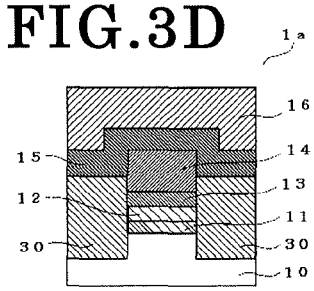
FIG.3D
FIG.3E

SEMICONDUCTOR DEVICE AND METHOD OF FABRICATING THE SAME

CROSS REFERENCE TO RELATED APPLICATION

This application is based upon and claims the benefit of priority from prior Japanese Patent Application No. 2012-059478, filed on Mar. 15, 2012, the entire contents of which are incorporated herein by reference.

FIELD

An exemplary embodiment described herein generally relates to a semiconductor device and a method of manufacturing the semiconductor device.

BACKGROUND

In a non-volatile semiconductor memory device typified by a NAND type memory, when a control gate voltage is set to be higher in order to obtain a constant floating gate voltage in a rewriting operation, deterioration of a gate insulator is faster, and breakdown of the gate insulator may be occur.

Therefore, it is necessary to improve charge injection efficiency into a charge storage layer such as the floating gate electrode to reduce a rewriting voltage.

BRIEF DESCRIPTION OF THE DRAWINGS

FIG. 1A is a cross sectional view showing a device structure along a word line direction in a semiconductor device according to an embodiment, and FIG. 1B is a cross sectional view showing the device structure along a bit line direction in the semiconductor device according to the embodiment;

FIG. 2A is a graph showing a tunnel current and a tungsten content of a tunnel insulator in the semiconductor device according to the embodiment, and FIG. 2B is a graph showing the tunnel current and a germanium content of the tunnel insulator in the semiconductor device according to the embodiment;

FIGS. 3A to 3E are cross sectional views showing a method of manufacturing the semiconductor device according to the embodiment;

DETAILED DESCRIPTION

Figure 4:
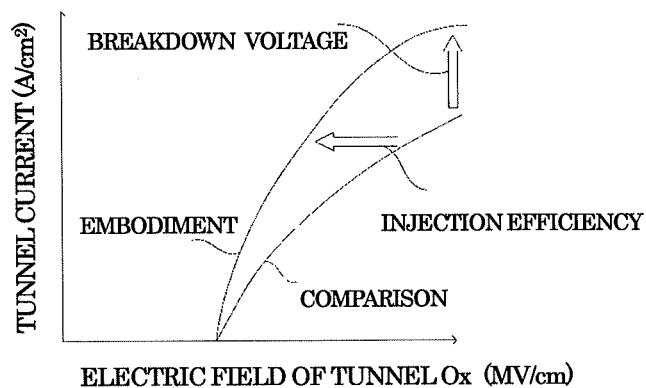
FIG. 4 is a graph showing the tunnel current and an electric field characteristic of the tunnel insulator in the semiconductor device according to the embodiment.

An aspect of the present embodiment, there is provided a semiconductor device, including a semiconductor substrate, a first insulator above the semiconductor substrate, the first insulator containing tungsten, germanium and silicon, a charge storage film on the first insulator, a second insulator on the charge storage film and, a control gate electrode on the second insulator.

Another aspect of the present embodiment, there is provided a method of fabricating a semiconductor device, including providing a tungsten-contained insulator and a germanium-contained insulator above a semiconductor substrate, providing a silicon-contained insulator on the tungsten-contained insulator or the germanium-contained insulator.

Hereinafter, the embodiment is described with reference to the drawings described above.

In the description, throughout all the drawings, the same components are represented by the same reference numerals. In addition, a dimensional ratio of the drawings is not limited to a ratio represented in the drawings.

Embodiment

A semiconductor device 1a according to an embodiment mainly includes tungsten and germanium in a gate insulator formed of oxide silicon, for example, $SiO_2$.

Device Structure of Semiconductor Device

A device structure of the semiconductor device 1a according to the embodiment is described with reference to FIGS. 1A, 1B and FIGS. 2A, 2B. FIG. 1A is a cross sectional view showing a device structure along a word line direction in a semiconductor device 1a according to the embodiment, and FIG. 1B is a cross sectional view showing the device structure along a bit line direction in the semiconductor device 1a according to the embodiment. FIG. 2A is a graph showing a tunnel current related to a tungsten content of a tunnel insulator according to the embodiment, and FIG. 2B is a graph showing the tunnel current and a germanium content of the tunnel insulator according to the embodiment.

As shown in FIG. 1A, the semiconductor device 1a according to the embodiment includes a semiconductor substrate 10 and a tunnel insulator 50 (first insulator) provided on the semiconductor substrate 10. As the semiconductor substrate 10, for example, silicon (Si) or the like is used. The tunnel insulator 50 is configured to be constituted with a tungsten-contained insulator 11, a germanium-contained insulator 12, and a silicon-contained insulator 13. The silicon-contained insulator 13 includes tungsten diffused from the tungsten-contained insulator 11 and germanium diffused from the germanium-contained insulator 12. The tungsten-contained insulator 11 includes tungsten oxide such as $WO_2$, for example. The germanium-contained insulator 12 includes germanium oxide such as GeO, for example. The silicon-contained insulator 13 includes silicon oxide such as $SiO_2$, for example. Further, in FIGS. 1A and 1B, for example, showing the structure of the embodiment, the tungsten-contained insulator 11 and the germanium-contained insulator 12 are represented as being divided as a matter of practical convenience. Thereafter, the laminated structure mentioned above is described as a $WO_2/GeO/SiO_2$ structure.

The semiconductor device 1a further includes a charge storage film 14 provided on the tunnel insulator 50, an intermediate insulator (second insulator) 15 provided on the charge storage film 14, and a control gate electrode 16 provided on the intermediate insulator 15.

As shown in FIG. 1B, in an area where an element of the semiconductor substrate 10 is formed, a source area 17a and a drain area 17b are provided. The area between the source area 17a and the drain area 17b is set to be as a channel area. In addition, in a periphery of the area where the element is formed, an element isolation film 30 having a shallow trench isolation (STI) structure formed of silicon oxide or the like is formed. Herein, STI is one of the element isolation methods in a semiconductor manufacturing step. In particular, after shallow grooves are formed on a substrate, an insulator such as the silicon oxide covers the grooves to form an element isolation area. Generally, the STI structure has an advantage in that the STI is rarely spread in a horizontal direction and the element is easily made to be fined.

Herein, in the insulator composed of the $WO_2/GeO/SiO_2$ provided on a silicon substrate, FIGS. 2A and 2B show results of measuring a leakage current when electrons are injected from the silicon substrate side or an electrode side. As shown in FIGS. 2A and 2B, a content of the tungsten or the germanium is changed. As shown in FIGS. 2A and 2B, the tungsten or the germanium included in the tungsten-contained insulator 11 and germanium-contained insulator 12, respectively, has desirably an area density of not less than $1.0 \times 10^{14}$ atoms/$cm^2$ and not more than $1.0 \times 10^{16}$ atoms/$cm^2$. Meanwhile, even in a case where a lower limit is $1.0 \times 10^{13}$ atoms/$cm^2$ or more, the lower limit is in an acceptable range, and therefore a following result may be obtained. Further, when the content of the tungsten or the germanium is higher than $1.0 \times 10^{16}$ atoms/$cm^2$, a film thickness of the tungsten-contained insulator 11 or the germanium-contained insulator 12 becomes thick. Therefore, there are problems in that a writing speed is reduced, the element is difficult to be fined, or the like. Further, when the tungsten and the germanium are diffused into the silicon-contained insulator 13, the area density of the tungsten and the germanium in the silicon-contained insulator 13 is approximately the same value as the above-described value.

Further, in the embodiment, although the drawings represent the intermediate insulator 15 as a single layer, which is not limited to the drawings, the intermediate insulator 15 may be formed of an ONO (oxide-nitride-oxide) film or the like having the laminated structure of a silicon oxide layer, silicon nitride layer, and silicon oxide.

Operation of Semiconductor Device

Next, an operation of the semiconductor device 1a is described.

The semiconductor device 1a is used as a non-volatile semiconductor memory (electrically erasable and programmable read only memory; EEPROM) which is electrically writable and erasable. As the operation, the electron is injected by applying high voltage to the control gate electrode 16 so that the electron passes through the tunnel insulator 50 from the side of the semiconductor substrate 10 into the charge storage film 14 via the intermediate insulator 15, or the electron is drawn out of the charge storage film 14. A case where the electron is injected in the charge storage film 15 is a writing operation, and a case where the electron is drawn out of the charge storage film 15 is an erasing operation.

Method of Manufacturing Semiconductor Device

Next, a method of manufacturing the semiconductor device 1a is described with reference to FIGS. 3A-3E. FIGS. 3A-3E are cross sectional views describing the method of manufacturing the semiconductor device 1a according to the embodiment.

As shown in FIG. 3A, in order to form the tunnel insulator 50 on the semiconductor substrate 10, firstly, a tungsten-contained insulator 11 ($WO_2$) having an area density of not less than $1.0 \times 10^{13}$ atoms/$cm^2$ and not more than $1.0 \times 10^{16}$ atoms/$cm^2$ and the film thickness of approximately 0.03 nm to 3 nm is formed. A film-depositing technique by using an atomic layer deposition (ALD), for example, is employed. ALD includes a process which a substrate surface is exposed alternately to different types of vapor reactants (precursors) to be able to control a growth as an atomic layer. Further, at an ALD process used in of the embodiment, a cycle in which tungsten hexafluoride and oxygen, for example, are alternately exposed on the surface of the semiconductor substrate 10 at a growth temperature of approximately 300° C., is repeatedly performed 1 time to about 20 times.

Thereafter, a germanium-contained insulator 12 (GeO) having the area density of not less than $1.0 \times 10^{13}$ atoms/$cm^2$ and not more than $1.0 \times 10^{16}$ atoms/$cm^2$ and the film thickness of approximately 0.03 nm to 3 nm is provided on the tungsten-contained insulator 11. In a case of the germanium-contained insulator 12, the film-depositing technique by using ALD, for example, is also applied. In the case of ALD, a cycle in which germanium hydride ($GeH_4$) and oxygen, for example, are alternately exposed on the surface of the semiconductor substrate 10 at a growth temperature of approximately 500° C., is repeatedly performed 1 time to about 20 times.

The silicon-contained insulator 13 ($SiO_2$) having the film thickness of approximately 0.1 nm to 20 nm is provided on the germanium-contained insulator 12. In a case of the silicon-contained insulator 13, the film-depositing technique by using ALD, for example, is also applied. In the case of ALD, a cycle in which a silicon organic compound and oxygen, for example, are alternately exposed on the surface of the semiconductor substrate 10 at a growth temperature of approximately 550° C., is repeatedly performed about 10 time to 200 times.

The method of forming the tungsten-contained insulator 11, the germanium-contained insulator 12, and the silicon-contained insulator 13 includes ALD, for example. However, a chemical sputtering in an oxidation atmosphere may be used. Further, the operation may be also performed by using a chemical vapor deposition (CVD), a physical vapor deposition (PVD), a coating method, an spray method, and the like.

Further, as described above, the forming steps of the germanium-contained insulator 12 and the silicon-contained insulator 13 after the forming of the tungsten-contained insulator 11 is accompanied with increasing the temperature of the semiconductor substrate. Accordingly, tungsten in the tungsten-contained insulator 11 and germanium in the germanium-contained insulator 12 are diffused to form the tunnel insulator 50. In addition, the tungsten and the germanium may be diffused by increasing the temperature in the forming steps of the charge storage film 14, the intermediate insulator 15, the element isolation film 30, and the control gate electrode 16, which are described below. Furthermore, a thermal treatment step to diffuse the tungsten and the germanium may be performed.

As described above, after the tunnel insulator 50 is formed, the charge storage film 14 having the film thickness of about 10 nm to 50 nm is provided by using CVD or the like. The charge storage film 14 is formed of poly crystalline silicon, for example. Next, a silicon nitride 40 having the film thickness of about 50 nm to 200 nm is provided on the charge storage film 14 by using CVD or the like. In addition, a silicon oxide 41 having the film thickness of about 50 nm to 400 nm is provided by using CVD or the like, to thereby obtain the device structure as shown in FIG. 3B.

Thereafter, a photoresist (not shown) is coated on the silicon oxide 41 and then the photoresist is patterned by an exposure printing. The silicon oxide 41 is etched by using the photoresist as an etching resistance mask. After etching, the photoresist is removed. A part of the silicon nitride 40, the charge storage film 14, the silicon-contained insulator 13, the germanium-contained insulator 12, the tungsten-contained insulator 11 and the semiconductor substrate 10 is etched using the etched silicon oxide 41 as a mask. As a result, the grooves for the element isolation are formed. Further, the element isolation film 30 having the thickness of about 200 nm to 1500 nm is provided by using a coating technology and the element isolation grooves are buried. As a result, the structure as shown in FIG. 3C is obtained. In addition, in a state as shown in FIG. 3C, the element isolation film 30 is carried out to be higher density by performing the thermal treatment under an oxygen atmosphere or a water-vapor atmosphere.

Next, the silicon nitride 40 is used as a stopper to perform planarization by using a chemical mechanical polishing (CMP) which increases a polishing effect by the machine using an abrasive (slurry) and is capable of obtaining a smooth polished surface. Further, only an element isolation film 30 is etched using an etching condition having selectivity with respect to the silicon nitride 40, that is, in a condition that the element isolation film 30 is etched more preferentially than the silicon nitride 40. Thereafter, the silicon nitride 40 is removed to obtain the structure as shown in FIG. 3D.

The intermediate insulator 15 is provided on the charge storage film 14 and the element isolation film 30 by using CVD or the like. In a case where the intermediate insulator 15, for example, is the ONO film as described above, the silicon oxide having the film thickness of about 1 nm to 10 nm is provided, the silicon nitride having the film thickness of about 1 nm to 5 nm is provided on an upper portion of the silicon oxide, and further the silicon oxide having the film thickness of about 1 nm to 10 nm is provided. In the above step, densification to densify the intermediate insulator 15 or to improve an interface (densification by the thermal treatment), oxidation to improve the interface, or the like may be performed. Further, by setting a shape of the intermediate insulator 15 to a U-shape around the charge storage film 14, a surface area of the charge storage film 14 in contact with the intermediate insulator 15 may be increased as possible. When a contact area becomes wide, the electric field involved with the intermediate insulator 15 becomes small. Therefore, an electric field stress applied to the intermediate insulator 15 can be relaxed. As a result, it is possible to suppress deterioration in the interface characteristic of the charge storage film 14 and the intermediate insulator 15, and deterioration in insulation property of the intermediate insulator 15.

The control gate electrode 16 is formed on the intermediate insulator 15 to obtain the device structure of the semiconductor device 1a as shown in FIG. 3E. Finally, the control gate electrode 16 is patterned by exposure printing (not shown).

Main Effect of the Embodiment

A main effect of the embodiment is described with reference to FIG. 4. FIG. 4 is a graph showing a relationship between a tunnel current and an electric field characteristic of a tunnel insulator according to the embodiment. A longitudinal axis represents an amount of the tunnel current, and a horizontal axis represents an electric field of the tunnel insulator (voltage applied to the tunnel insulator).

FIG. 4 shows the tunnel current and the electric field characteristic of the tunnel insulator according to a comparative example in addition to the embodiment. The comparative example is different from the embodiment in that a tunnel insulator which does not include both tungsten and germanium is used. That is to say, a structure of the tunnel insulator in a manufacturing step is a $GeO/SiO_2$ (not shown). Further, even when the structure of the tunnel insulator in the manufacturing step is a $WO_2/SiO_2$ or a $SiO_2$ single layer, the tunnel current and the electric field characteristic which is approximately in the same manner as that of the $GeO/SiO_2$ is obtained (not shown).

As shown in FIG. 4, the graph of the semiconductor device 1a according to the embodiment shows that a rising current with respect to the electric field of the tunnel insulator is steep. Further, in a low electric field side, a difference between a current value according to the embodiment and a current value according to the comparative example is small. Meanwhile, in a high electric field side, the tunnel current according to the embodiment is higher than that according to the comparative example by about a single digit. In other words, the effect is indicated that break down voltage of the semiconductor device 1a is improved. The result is considered because the tungsten and the germanium reduce an interface state density between the semiconductor substrate 10 and the tunnel insulator 50. In addition, the interface state density is a defect density formed on an interface between the semiconductor substrate 10 and the tunnel insulator 50.

Further, it is indicated that, in the low electric field (low applied voltage), the same leakage current as that according to the comparative example may flow, and, in the high electric field (high applied voltage), the same current as that according to the comparative example may flow at a lower electric field (applied voltage). That is to say, two of the effects realized based on the semiconductor device 1a according to the embodiment. As a first effect, an injection efficiency of an electron (effect of reducing a write voltage or an erase voltage) is improved in the high electric field side. As a second effect, a data (charge) retention characteristic is maintained in the low electric field side, (effect of maintaining a leakage current to be low). Therefore, a ratio of On to Off is increased.

The result described above is considered because the silicon-contained insulator 13 having low density is stacked in the manufacturing step. The silicon-contained insulator 13 having the low density has the effect in which permittivity of the tunnel insulator 50 is lowered and a barrier height is reduced. Therefore, a ratio of On to Off is increased by the effect.

Additionally, since a value of the tunnel current in the high electric field side is higher than that in the comparative example by about a single digit, the effect on improvement of break down voltage of the semiconductor device 1a is achieved.

In the embodiment, the tunnel insulator 50 is stacked as the structure of $WO_2/GeO/SiO_2$, so that the tunnel insulator 50 has the silicon-contained insulator 13 in which the tungsten and the germanium are diffused. Meanwhile, in the processing step, when the tungsten-contained insulator 11 and the germanium-contained insulator 12 are reversed, that is, even when stacked so as to become the structure of the $GeO/WO_2/SiO_2$, the same effect can be obtained.

Modification

Figures 5A, 5B:
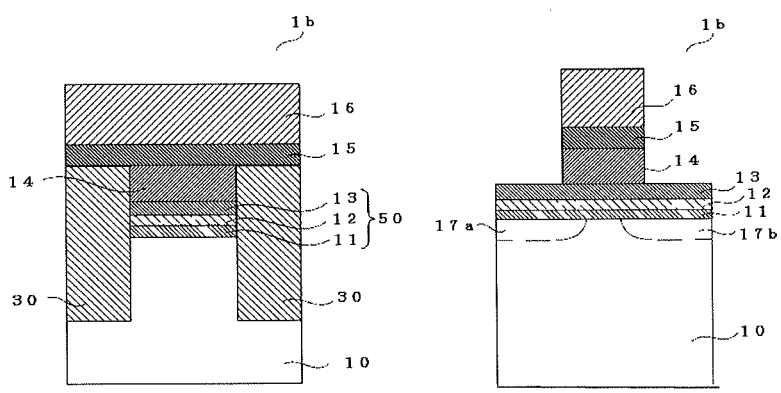
FIG. 5A is a cross sectional view showing a device structure along a word line direction in a semiconductor device according to a modification of the embodiment.
FIG. 5B is a cross sectional view showing the device structure along a bit line direction in the semiconductor device according to the modification of the embodiment.

Herein, a modification of the embodiment is described with reference to FIGS. 5A and 5B. FIG. 5A is a cross sectional view along a word line direction in a semiconductor device 1b according to the modification, and FIG. 5B is a cross sectional view along a bit line direction in the semiconductor device 1b according to the modification. Further, a dimensional ratio of the drawings is not limited to a ratio represented in the drawings.

The semiconductor device 1b according to the modification is different from the semiconductor device 1a according to the embodiment, in that the intermediate insulator 15 has a planar structure.

A contact area between the charge storage film 14 and the intermediate insulator 15 is narrower than that of the semiconductor device 1a by having the planar structure of the intermediate insulator 15 according to the embodiment. Therefore, an electric field stress applied to the intermediate insulator 15 described above, may not be reduced. Meanwhile, the effect in which the injection efficiency and break down voltage are improved can be obtained as the same as that of the semiconductor device 1a according to the embodiment.

In the embodiment, the structure of the $WO_2/GeO/SiO_2$ is used when the tunnel insulator 50 is provided. Meanwhile, the tunnel insulator 50 is not limited to the structure in the embodiment. The silicon-contained insulator 13 may be SiON including nitrogen (N) or a combination thereof, for example. The germanium-contained insulator 12 may be GeB, GeC, GeN, Ge, GeON, and the like which include boron (B), carbon (C), or the like, or a combination thereof. Further, the tungsten-contained insulator 11 may be WB, WC, WN, W, WON and the like, or a combination thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate;
a first insulator above the semiconductor substrate, the first insulator containing tungsten, germanium and silicon;
a charge storage film on the first insulator;
a second insulator on the charge storage film and
a control gate electrode on the second insulator.

2. The semiconductor device of claim 1, wherein
the first insulator has a stacked structure in which a tungsten-contained insulator, a germanium-contained insulator and a silicon-contained insulator are laminated.

3. The semiconductor device of claim 2, wherein
the tungsten-contained insulator, the germanium-contained insulator and the silicon-contained insulator are laminated in an order in the first insulator.

4. The semiconductor device of claim 2, wherein
the silicon-contained insulator includes tungsten and germanium.

5. The semiconductor device of claim 4, wherein
the silicon-contained insulator includes tungsten and germanium diffused from the tungsten-contained insulator and the germanium-contained insulator, respectively.

6. The semiconductor device of claim 1, wherein
area densities of both tungsten and germanium in the first insulator are not less than $1.0\times10^{13}$ atoms/cm$^2$ and not more than $1.0\times10^{16}$ atoms/cm$^2$.

7. The semiconductor device of claim 6, wherein
area densities of both tungsten and germanium in the first insulator are not less than $1.0\times10^{14}$ atoms/cm$^2$ and not more than $1.0\times10^{16}$ atoms/cm$^2$.

8. The semiconductor device of claim 2, wherein
the silicon-contained insulator is composed of a silicon oxide film including nitrogen.

9. The semiconductor device of claim 2, wherein
the germanium-contained insulator includes at least one selected from oxygen, nitrogen, boron and carbon.

10. The semiconductor device of claim 2, wherein
the tungsten-contained insulator includes at least one selected from oxygen, nitrogen, boron and carbon.

11. A method of fabricating a semiconductor device, comprising:
providing a tungsten-contained insulator and a germanium-contained insulator above a semiconductor substrate;
providing a silicon-contained insulator on the tungsten-contained insulator or the germanium-contained insulator.

12. The method of claim 11, further comprising:
thermally treating the semiconductor substrate to diffuse both tungsten in the tungsten-contained insulator and germanium in the germanium-contained insulator into the silicon-contained insulator, after providing the silicon-contained insulator.

13. The method of claim 11, further comprising:
providing a charge storage film on the silicon-contained insulator, after providing the silicon-contained insulator,
selectively removing a part of the charge storage film, the silicon-contained insulator, the tungsten-contained insulator and the germanium-contained insulator to form a groove;
providing an element isolation film in the groove;
providing an intermediate insulator on the charge storage film and the element isolation film;
providing a control gate electrode on the intermediate insulator; and
selectively removing the control gate electrode.

14. The method of claim 13, further comprising:
thermally treating the semiconductor substrate to diffuse tungsten and germanium from the tungsten-contained insulator and the germanium-contained insulator, respectively, to the silicon-contained insulator.

15. The method of claim 11, wherein
area densities of both tungsten in the tungsten-contained insulator and germanium in the germanium-contained insulator are not less than $1.0\times10^{13}$ atoms/cm$^2$ and not more than $1.0\times10^{16}$ atoms/cm$^2$.

16. The method of claim 15, wherein
area densities of both tungsten in the tungsten-contained insulator and germanium in the germanium-contained insulator are not less than $1.0\times10^{14}$ atoms/cm$^2$ and not more than $1.0\times10^{16}$ atoms/cm$^2$.

17. The method of claim 11, wherein
the silicon-contained insulator is composed of a silicon oxide film including nitrogen.

18. The method of claim 11, wherein
the germanium-contained insulator includes at least one selected from oxygen, nitrogen, boron and carbon.

19. The method of claim 11, wherein
the tungsten-contained insulator includes at least one selected from oxygen, nitrogen, boron and carbon.

20. The method of claim 11, wherein
atomic layer deposition is utilized in at least one selected from providing the tungsten-contained insulator, providing the germanium-contained insulator and the silicon-contained insulator.

* * * * *